United States Patent
Avramescu et al.

(10) Patent No.: US 8,390,004 B2
(45) Date of Patent: Mar. 5, 2013

(54) LIGHT-EMITTING STRUCTURE

(75) Inventors: Adrian Stefan Avramescu, Regensburg (DE); Hans-Juergen Lugauer, Sinzing (DE); Matthias Peter, Alteglofsheim (DE); Stephan Miller, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 145 days.

(21) Appl. No.: 12/676,592

(22) PCT Filed: Aug. 25, 2008

(86) PCT No.: PCT/DE2008/001426
§ 371 (c)(1),
(2), (4) Date: Mar. 4, 2010

(87) PCT Pub. No.: WO2009/033448
PCT Pub. Date: Mar. 19, 2009

(65) Prior Publication Data
US 2010/0207098 A1      Aug. 19, 2010

(30) Foreign Application Priority Data

Sep. 10, 2007 (DE) .................. 10 2007 043 096
Dec. 6, 2007 (DE) .................. 10 2007 058 723

(51) Int. Cl.
| H01L 27/15 | (2006.01) |
| H01L 29/16 | (2006.01) |
| H01L 31/12 | (2006.01) |
| H01L 33/00 | (2010.01) |
| H01L 29/06 | (2006.01) |
| H01L 31/00 | (2006.01) |

(52) U.S. Cl. .............. 257/82; 257/14; 257/53; 257/184; 257/431; 257/E33.001; 257/E25.032; 257/E33.008; 257/E31.033

(58) Field of Classification Search ............ 257/14, 257/53, 82, 184, 431, E33.001, E25.032, 257/E33.008, E31.033
See application file for complete search history.

(56) References Cited

U.S. PATENT DOCUMENTS

| 6,066,861 A | 5/2000 | Höhn et al. |
| 6,526,083 B1 * | 2/2003 | Kneissl et al. ............. 372/50.22 |
| 6,577,073 B2 | 6/2003 | Shimizu et al. |

(Continued)

FOREIGN PATENT DOCUMENTS

| CN | 1528037 A | 9/2004 |
| CN | 1741290 A | 3/2006 |

(Continued)

OTHER PUBLICATIONS

Qi, Y. D., et at., "Dual Wavelength InGaN/GaN Multi-Quantum Well LEDs Grown by Metalorganic Vapor Phase Epitaxy," Journal of Crystal Growth, Dec. 2004, pp. 333-340, vol. 272, Issues 1-4, Elsevier B.V., Amsterdam.

*Primary Examiner* — Michelle Mandala
(74) *Attorney, Agent, or Firm* — Slater & Matsil, L.L.P.

(57) ABSTRACT

A light-emitting structure includes a p-doped region for injecting holes and an n-doped region for injecting electrons. At least one InGaN quantum well of a first type and at least one InGaN quantum well of a second type are arranged between the n-doped region and the p-doped region. The InGaN quantum well of the second type has a higher indium content than the InGaN quantum well of the first type.

15 Claims, 3 Drawing Sheets

U.S. PATENT DOCUMENTS

| | | | |
|---|---|---|---|
| 6,969,874 B1 * | 11/2005 | Gee et al. | 257/98 |
| 6,995,389 B2 | 2/2006 | Kim et al. | |
| 7,042,017 B2 | 5/2006 | Yamada | |
| 7,084,436 B2 | 8/2006 | DenBaars et al. | |
| 7,323,721 B2 | 1/2008 | Liao et al. | |
| RE40,230 E * | 4/2008 | Kneissl et al. | 372/50.1 |
| 7,638,809 B2 | 12/2009 | Ohba | |
| 2002/0070681 A1 | 6/2002 | Shimizu et al. | |
| 2003/0085409 A1 | 5/2003 | Shen et al. | |
| 2003/0091085 A1 * | 5/2003 | Northrup et al. | 372/50 |
| 2003/0122482 A1 | 7/2003 | Yamanaka et al. | |
| 2003/0151044 A1 | 8/2003 | Yamada | |
| 2003/0209704 A1 | 11/2003 | Yamada | |
| 2004/0051107 A1 | 3/2004 | Nagahama et al. | |
| 2004/0183088 A1 | 9/2004 | DenBaars et al. | |
| 2004/0256611 A1 | 12/2004 | Kim et al. | |
| 2005/0067613 A1 * | 3/2005 | Kim | 257/14 |
| 2006/0006375 A1 | 1/2006 | Ou et al. | |
| 2006/0043385 A1 | 3/2006 | Wang et al. | |
| 2006/0049415 A1 | 3/2006 | Liao et al. | |
| 2006/0086932 A1 | 4/2006 | Kim et al. | |
| 2007/0007541 A1 | 1/2007 | Kim et al. | |
| 2007/0026551 A1 | 2/2007 | Sato et al. | |
| 2007/0034883 A1 | 2/2007 | Ohba | |
| 2007/0114540 A1 | 5/2007 | Lee et al. | |
| 2007/0187697 A1 | 8/2007 | Wu et al. | |
| 2009/0184329 A1 | 7/2009 | Miki et al. | |
| 2010/0025652 A1 | 2/2010 | Stauss | |
| 2010/0090244 A1 | 4/2010 | Ohba | |
| 2010/0141172 A1 | 6/2010 | Uchida et al. | |

FOREIGN PATENT DOCUMENTS

| | | |
|---|---|---|
| DE | 10 2006 002 151 A1 | 1/2007 |
| DE | 60 2004 001 927 T2 | 9/2007 |
| DE | 10 2006 025 964 A1 | 12/2007 |
| EP | 1 160 883 A2 | 12/2001 |
| EP | 1 670 068 A1 | 6/2006 |
| GB | 2 361 354 A | 10/2001 |
| JP | 2001-028458 A | 1/2001 |
| JP | 2002-374006 A | 12/2002 |
| JP | 2006-066903 A | 3/2006 |
| JP | 2006-080469 A | 3/2006 |
| JP | 2006-128607 A | 5/2006 |
| JP | 2006-253125 A | 9/2006 |
| JP | 2007-036113 A | 2/2007 |
| WO | WO-98/12757 A1 | 3/1998 |
| WO | WO-2006/098250 A1 | 9/2006 |

* cited by examiner

LIGHT-EMITTING STRUCTURE

This patent application is a national phase filing under section 371 of PCT/DE2008/001426, filed Aug. 25, 2008, which claims the priority of German patent applications 10 2007 043 096.7, filed Sep. 10, 2007 and 10 2007 058 723.8, filed Dec. 6, 2007, each of which is incorporated herein by reference in its entirety.

TECHNICAL FIELD

The invention relates to a light-emitting structure containing indium gallium nitride quantum wells.

BACKGROUND

In light-emitting structures, indium gallium nitride quantum wells (hereinafter "InGaN quantum wells") are separated by (In)GaN barrier layers. The heterojunction between the quantum wells and the barrier layers forms a potential barrier, which impedes the injection of charge carriers, i.e. of electrons and holes. The potential barriers formed by the heterojunctions arise as a result of the high piezoelectric fields between the quantum wells and the barrier layers. Since the number of heterojunctions increases with the number of quantum wells, it is difficult to construct a light-emitting structure that contains a plurality of quantum wells.

SUMMARY OF THE INVENTION

Embodiments of the invention provide a light-emitting structure that displays high radiation efficiency.

A light-emitting structure includes a p-doped region and an n-doped region. The p-doped region is provided for injecting holes. The n-doped region is provided for injecting electrons.

Between the stated regions there is arranged at least one InGaN quantum well of a first type. Preferably, a plurality of quantum wells of the first type are arranged between the regions. The quantum wells of the first type are separated from one another by (In)GaN barrier layers of a first type, i.e. barrier layers of a first type that may contain at least GaN and optionally also indium.

Furthermore, at least one InGaN quantum well of a second type is provided. The quantum well of the second type is distinguished in that it includes a higher indium content than the quantum well of the first type.

In particular, the quantum well of the first type has a relatively low indium content and the quantum well of the second type has a relatively high indium content. The light-emitting structure thus contains an active zone, which is formed in particular from a plurality of quantum wells with a low indium content, which are embedded between barrier layers. Furthermore, at least one quantum well is provided with a high indium content in the active zone. Preferably, the at least one quantum well of the first type adjoins the n-doped region, while the at least one quantum well of the second type is arranged adjacent the p-doped region. The quantum well of the first type is thus arranged on the n-side of the active zone, while the quantum well of the second type is arranged on the p-side of the active zone of the structure. This configuration makes it possible to continue injecting charge carriers that have already escaped, whereby the efficiency of the light-emitting component may be improved. In particular, the advantage is obtained that the low indium content of the quantum wells of the first type leads to reduced piezoelectric fields at the heterojunctions with the barrier layers. This in particular allows effective injection of holes into the quantum well structure, compared with the case of a quantum well structure with a high indium content.

In the case of a quantum well with a high indium content on the side of the active zone that adjoins the p-doped region, the potential barrier on the side of the p-doped region may be reduced by control of the p-doping and the selection of a suitable doping profile in the vicinity of the quantum well structure. In particular, magnesium is used as the p-dopant.

In one embodiment of the light-emitting structure, the quantum wells are configured in such a way that the quantum well of the first type emits light in the UV range, while the quantum well of the second type emits light in the blue-green range.

According to one embodiment, the indium content of the quantum wells of the first type is adjusted such that they emit radiation in a wavelength range of between 370 nm and 440 nm. If the barrier layers of the first type are made from GaN, the wavelength of the radiation emitted by the quantum wells of the first type is in particular between 370 nm and 420 nm. If, on the other hand, the barrier layers of the first type are formed from InGaN, the wavelength amounts in particular to between 390 nm and 440 nm.

In the case of the quantum wells of the first type, the indium content is preferably between 4% and 12%. In particular, the quantum wells of the first type contain $In_xGa_{1-x}N$, wherein $0.04 \leq x \leq 0.12$.

The thickness of the quantum wells of the first type amounts preferably to between 2 nm and 7 nm, in particular to between 2 nm and 4 nm.

The indium content of the barrier layers of the first type is preferably adjusted such that it is lower than 5%. In particular, the barrier layers of the first type contain $In_xGa_{1-x}N$, wherein $x \leq 0.05$. The difference between the indium content in the barrier layers of the first type and the quantum wells of the first type should be less than 7%. Particularly preferably, the difference should be less than 5%.

According to one embodiment of the structure, the indium content of the quantum well of the second type is adjusted such that it emits radiation in a wavelength range of between 440 nm and 580 nm.

The indium content of the quantum well of the second type preferably amounts to between 12% and 25%. In particular, the quantum well of the second type contains $In_xGa_{1-x}N$, wherein $0.12 \leq x \leq 0.25$. The thickness of the quantum well of the second type amounts preferably to between 2 nm and 7 nm, in particular to between 2 nm and 4 nm.

Additionally, in order to control the intensity ratio between the long-wave and short-wave radiation, the doping and doping profile of the barrier layers may be suitably adjusted. According to one embodiment, the barrier layers of the first type are doped with silicon, specifically with a concentration of between $1.0 \times 10^{17}/cm^3$ and $2.0 \times 10^{19}/cm^3$.

To separate the quantum wells of the first type from the quantum well of the second type, a barrier layer of a second type may additionally be provided between these two types of quantum wells. Particularly preferably, a quantum well of the first type and a quantum well of the second type directly adjoin the barrier layer of the second type. In order to suitably adjust the intensity ratio between the long-wave and the short-wave radiation, the barrier layer of the second type is doped with silicon with a concentration of no more than $5 \times 10^{17}/cm^3$. The barrier layer of the second type is the barrier layer between the quantum well with the high indium content and the quantum well with the low indium content.

A further parameter for controlling the intensity ratio consists in suitable selection of the thickness of the barrier layers. The thickness of the barrier layers amounts preferably to between 3 nm and 15 nm, in particular to between 6 nm and 12 nm. In this respect, the thickness of the barrier layers of the first type and the thickness of the barrier layer of the second type may be selected to be identical or indeed different.

In order to adjust the intensity ratio of the long-wave and the short-wave emission, the number of quantum wells of the first type may also be adjusted.

The number of quantum wells is preferably between 1 and 30.

Although higher potential barriers arise on the side of the active zone adjoining the p-doped region due to the relatively high indium content of the quantum well of the second type, these may be reduced by suitable p-doping, such that sufficiently good hole conduction is ensured. However, hole conduction does diminish towards the quantum wells of the first type. Nevertheless, in order to allow sufficiently good hole injection into the quantum wells of the first type, the potential barrier is lowered. This may be achieved by a relatively low indium content in the quantum wells of the first type. The indium content is advantageously lower in the quantum wells of the first type than in the quantum well of the second type. In addition, the difference between the indium content of the quantum wells of the first type and the indium content of the barrier layers of the first type is preferably reduced, which may be achieved by increasing the indium content in the barrier layers. However, the reduced difference leads to a reduced inclusion of charge carriers in the quantum wells. A plurality of quantum wells of the first type are, therefore, advantageously used, while one quantum well of the second type may suffice. The number of quantum wells of the first type is thus preferably greater than the number of quantum wells of the second type. The structure described here may be used to increase the efficiency and color reproduction of a luminescent material. The luminescent material may be present in pure form and thus emit in a preferred wavelength range. Alternatively, a mixture of luminescent materials may be considered which emits a relatively broad spectrum of wavelengths.

The luminescent material or the mixture of luminescent materials may be optimized with regard to brightness and/or color reproduction, in particular in relation to the relative intensity of the radiation peaks that are emitted by the structure.

The structure described here may, above all, be used in conjunction with a luminescent material or mixtures of luminescent materials that have emission wavelengths similar to the quantum wells of the structure. The luminescent material may be optically pumped by the light with the short wavelength emitted by the structure. The resultant emitted spectrum is then manifested, for example, in intensified emission in the blue or green range with broader background emission in the blue or green range. This broadband blue or broadband green emission is perceived by the human eye as more pleasant or softer than the light of the quantum wells emitted in a relatively narrow wavelength range.

If necessary, the proportion of light with short wavelength which is left after absorption in the luminescent material, may be absorbed by a corresponding absorber material, which may be present as a coating or as an encapsulation.

Accordingly, a component with a light-emitting structure is provided, in which at least one luminescent material is arranged downstream of the light-emitting structure in the emitting direction of the quantum wells, which luminescent material is optically pumped by the light of the quantum wells, in particular the quantum wells of the first type.

The luminescent material may here be present in pure form or as a mixture of a plurality of luminescent materials. For example, the luminescent material or the mixture may exhibit similar emission wavelengths as the quantum wells.

The luminescent material may be present in types separate from one another and which in turn emit light in different wavelength ranges.

BRIEF DESCRIPTION OF THE DRAWINGS

The light-emitting structure and the component are explained in more detail below with reference to exemplary embodiments.

Figure 2:
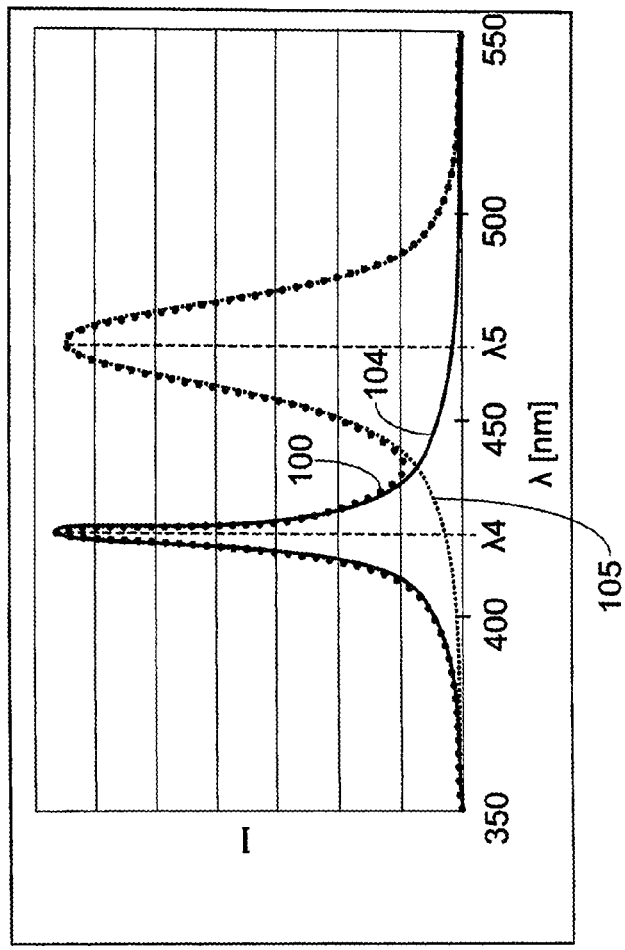
FIG. 2 shows the spectrum emitted by the light-emitting structure as a function of wavelength.

The figures should not be regarded as being to scale, individual dimensions possibly being shown on an enlarged or reduced scale to improve representation.

Elements that perform the same function are provided in the figures with the same reference numerals.

DETAILED DESCRIPTION OF ILLUSTRATIVE EMBODIMENTS

Figure 1:
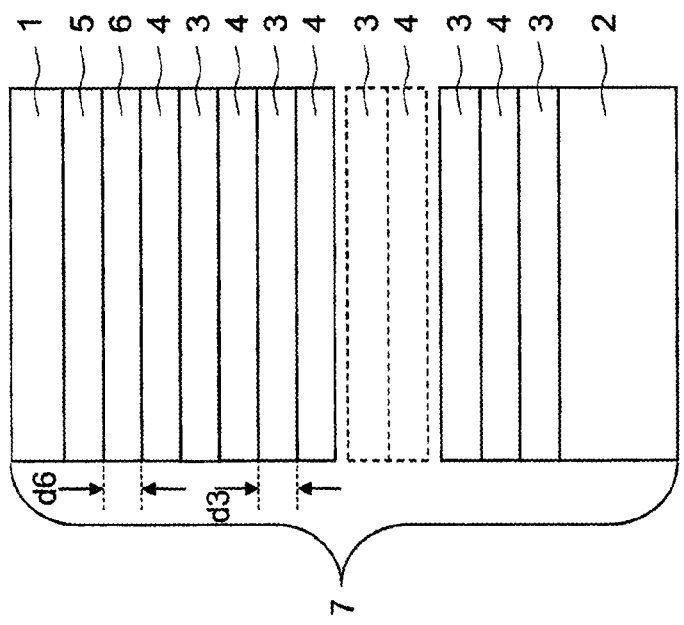
FIG. 1 is a schematic, cross-sectional view of a light-emitting structure.

FIG. 1 shows a light-emitting structure 7, with a stack of layers lying one above the other. At the bottom of the structure is an n-doped region 2, which is provided for injecting electrons into the light-emitting structure when an electrical voltage is applied.

Above the n-doped region there are arranged a plurality of quantum wells 4 of a first type. The quantum wells 4 of the first type contain InGaN, the indium content being selected such that the quantum wells emit radiation in the range of UV or violet light when excited. The quantum wells 4 of the first type are separated from one another by barrier layers 3 of a first type. In the upper area of the light-emitting structure 7 there is arranged a quantum well 5 of a second type, which likewise contains indium gallium nitride, the indium content of the quantum well 5 of the second type being selected such that emission takes place in the blue or green range of the spectrum. The quantum well 5 of the second type is separated from a directly adjacent quantum well 4 of the first type by a barrier layer 6 of the second type. Preferably, all the quantum wells 4 of the first type are located on one side of the quantum well 5 of the second type.

On the top of the quantum well 5 of the second type there is located a p-conducting region 1, which serves to inject holes into the light-emitting structure 7. The thickness d6 of the barrier layer 6 of the second type may preferably be between 3 nm and 15 nm, in particular between 2 nm and 6 nm. The same applies to the thickness d3 of the barrier layers 3 of the first type, which have a thickness ranging between 3 nm and 15 nm, in particular between 2 nm and 6 nm. The thicknesses d3 and d6 may be the same or different from one another.

To control the potential barrier on the p-side, a magnesium doping profile is provided, wherein the magnesium concentration rises continuously, starting at the lower boundary of the p-conducting region 1, to a maximum at a distance of between 2 nm and 15 nm from the lower boundary of the p-conducting region. The maximum magnesium concentration is here between 1.0 and $100 \times 10^{18}$ 1/cm$^3$. From this maximum, the magnesium concentration declines again somewhat in the direction of the p-contact of the arrangement until it reaches a minimum concentration. The minimum magnesium concentration here amounts to approximately a third to a half of the magnesium concentration at its maximum. The magnesium concentration increases further in the direction of the p-contact, which may, for example, take the form of a gallium nitride layer, and is then preferably greater than $5.0 \times 10^{19}$ 1/cm$^3$.

The number of quantum wells of the first type may vary, which is indicated by the combination illustrated by broken lines of first quantum wells 4 of the first type with barrier layers 3 of the first type. The number of quantum wells may vary, for example, between 1 and 30. The structure illustrated overall in FIG. 1 may be part of a component, in particular of a light-emitting diode (LED).

FIG. 2 shows the emission spectrum of a light-emitting structure, as illustrated by way of example in FIG. 1. The quantum wells of the first type emit light, the intensity I of which is shown as a function of the wavelength $\lambda$ by the curve 104. The curve 104 shows light emission as a function of wavelength for the quantum wells 4 of the first type.

The quantum well of the second type emits light, the intensity of which is shown as a function of wavelength by the curve 105. This shows the emission of the quantum well of the second type as a function of wavelength. The overall spectrum of the emitted light is shown by the curve 100.

The radiation spectrum according to FIG. 2 arises, for example, from using barrier layers of the first type with an indium concentration of no more than 3%, quantum wells of the first type with an indium concentration of approximately 8%, barrier layers of the second type with an indium concentration of no more than 5% and a quantum well of the second type with an indium concentration of up to 18%. In particular, the barrier layers of the first type contain $In_xGa_{1-x}N$, wherein $x \leq 0.03$, the quantum wells of the first type contain $IN_xGa_{1-x}N$, wherein $x \approx 0.08$, the barrier layers of the second type contain $In_xGa_{1-x}N$, wherein $x \leq 0.05$, and the quantum well of the second type contains $In_xGa_{1-x}N$, wherein $x \leq 0.18$.

The light emitted by the quantum wells of the first type has a peak wavelength $\lambda 4$ of between 400 nm and 450 nm.

The light emitted by the quantum well of the second type has a peak wavelength $\lambda 5$ of between 450 nm and 500 nm.

Figure 3:
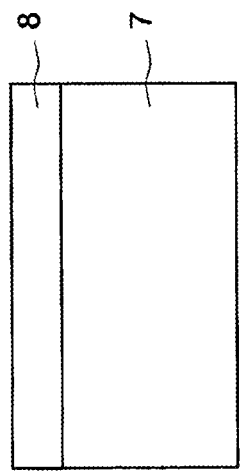
FIG. 3 shows a component with a light-emitting structure and a mixture of luminescent materials.

FIG. 3 shows a component in which a layer 8 of luminescent material has been applied to a light-emitting structure 7, as shown, for example, in FIG. 1. The layer 8 of luminescent material here contains a mixture of luminescent materials.

In the example of FIG. 3, the layer 8 of luminescent material may contain blue-emitting luminescent material in the form of nitride-silicate-based luminescent material. Green-emitting luminescent material may be present, for example, as YAG-based luminescent material. For example, the substance YAG:Ce($Y_3Al_5O_{12}$:Ce$^{3+}$) may be used as the luminescent material.

The layer 8 of luminescent material may partially absorb the light emitted by the light-emitting structure 7 in the manner of a pumping process and itself emit light of various wavelengths.

Figures 6, 7:
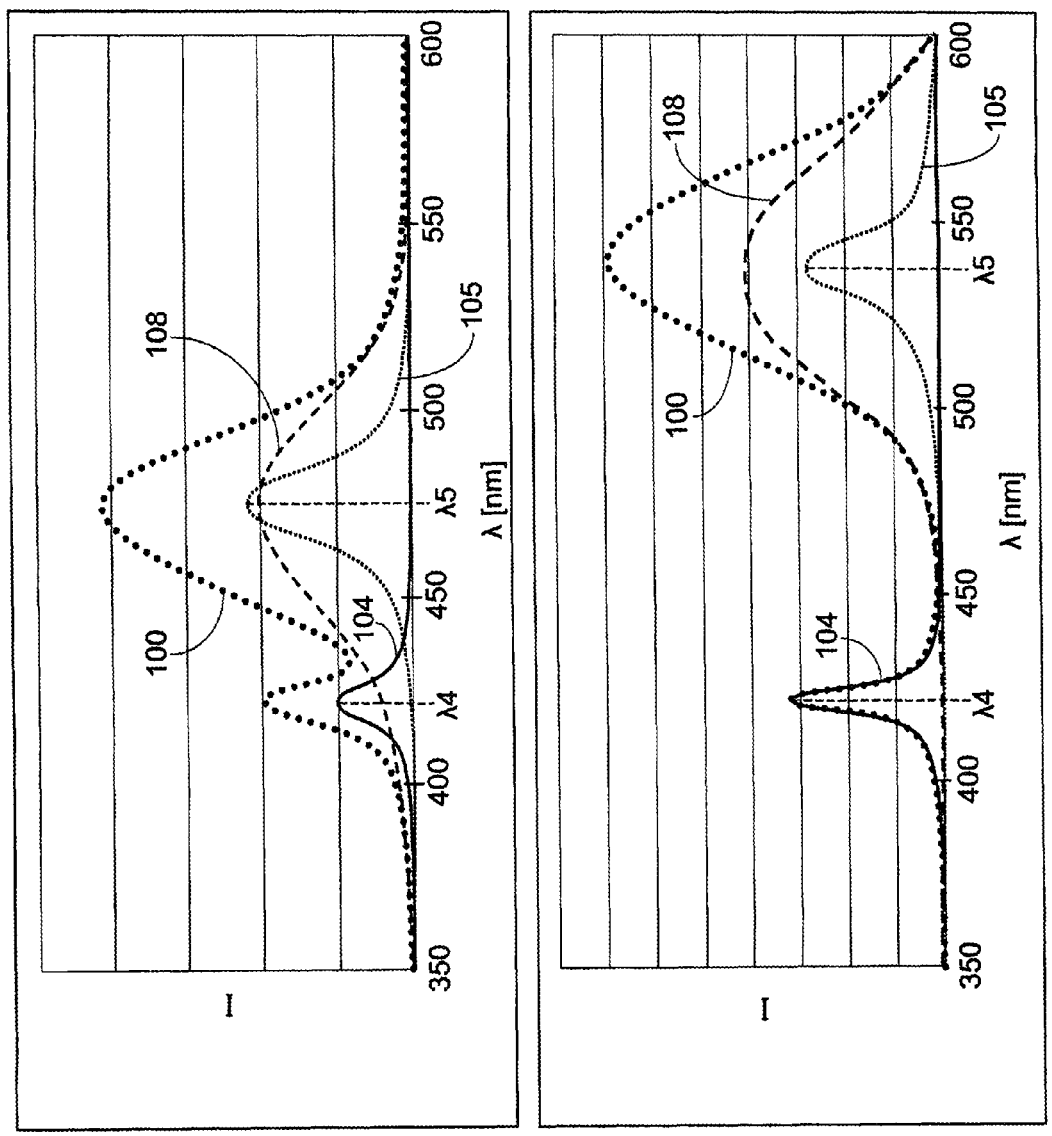
FIG. 6 shows the light emitted by a component according to FIG. 3 with a broad peak in the blue light range as a function of wavelength.
FIG. 7 shows the light emitted by a component according to FIG. 3 with a broad peak in the green light range as a function of wavelength.

The emitted light of an arrangement like that illustrated in FIG. 3 is shown, for example, in FIG. 6. In addition to the peak wavelengths $\lambda 4$ and $\lambda 5$, which arise in a similar manner as in FIG. 2, there is also the light emitted by the layer 8 of luminescent material, the intensity of which is shown as a function of wavelength by the curve 108 in FIG. 6. The light emitted by the layer 8 of luminescent material is superimposed with the radiation with the peak wavelengths $\lambda 4$ and $\lambda 5$ to yield the overall emission, which is indicated by the overall spectrum 100. It is also clear that, by using the layer 8 of luminescent material, the width of the peak emitted in the blue spectral range may, in particular, be markedly broadened, which makes perception by the human eye more pleasant.

A further example is shown in FIG. 7. In this case, the radiation peak of the quantum well of the second type is selected in the range between 500 nm and 550 nm. By appropriately selecting the layer 8 of luminescent material, emission by the layer 8 of luminescent material may likewise be achieved in this wavelength range. The light emitted by the layer 8 of luminescent material is shown by the curve 108. In the overall spectrum, which is indicated by the curve 100, it is clear that use of the layer 8 of luminescent material gives rise to broadening of the radiation peak in the green light range with a peak wavelength in the range of the peak wavelength $\lambda 5$. This makes the light impression more pleasant for the human eye.

Figure 4:
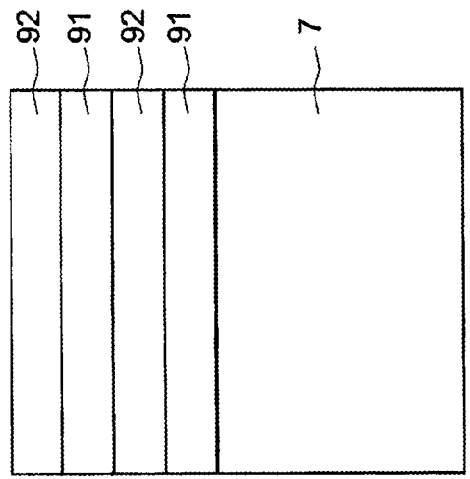
FIG. 4 shows a component with a light-emitting structure and different luminescent materials.

FIG. 4 shows a component in which luminescent material is also arranged on the top of a light-emitting structure 7. Unlike in the embodiment according to FIG. 3, two different types of luminescent material are provided in layers arranged alternately one above the other. Layers 91 of luminescent material of a first type here alternate with layers 92 of luminescent material of a second type.

The layer 91 of luminescent material may preferably be a green-emitting luminescent material, while a yellow-red-(orange-)emitting luminescent material is selected for the layer 92 of luminescent material. A difference between the layers 91 and 92 of luminescent material may lie in their excitation efficiency. The excitation efficiency of the layer 91 of luminescent material is better for the wavelength $\lambda 4$, while the layer 92 of luminescent material has better excitation efficiency for the wavelength $\lambda 5$.

Figure 5:
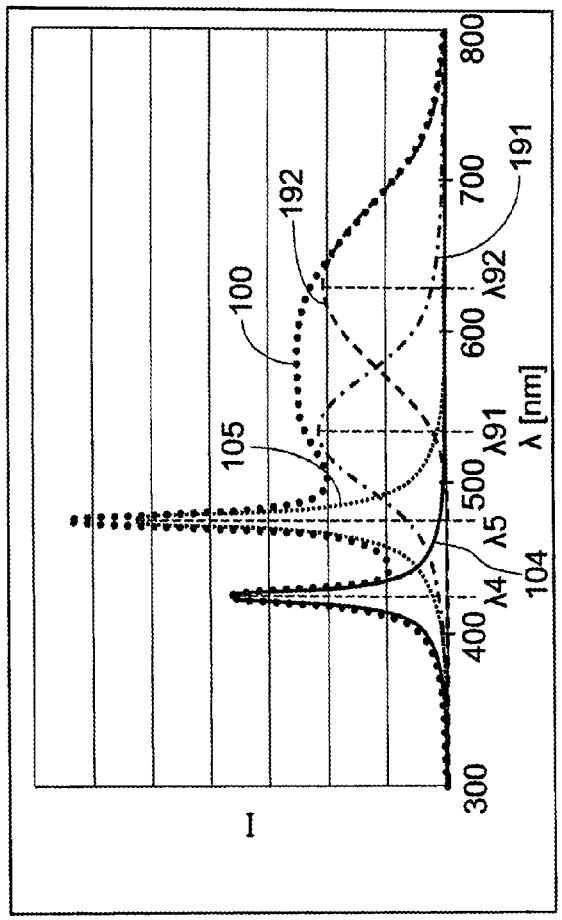
FIG. 5 shows the light emitted by a component according to FIG. 4 as a function of wavelength.

With the assistance of the embodiment according to FIG. 4, a radiation spectrum may be achieved as shown in FIG. 5. Here, the use of different luminescent materials also allows different light wavelengths to be emitted by the luminescent materials. The layer 91 of luminescent material of the first type here emits light with a peak wavelength $\lambda 91$. The intensity as a function of wavelength is indicated by the curve 191. The layer 92 of luminescent material of the second type emits light with a peak wavelength $\lambda 92$ which is greater than the peak wavelength $\lambda 91$. The intensity of the light emitted by the layer 92 of luminescent material of the second type is illustrated by the curve 192. In the overall spectrum 100 a very even intensity is obtained, which extends from the blue range to between 500 nm and beyond 600 nm. The 4-wavelength emitter shown in FIG. 4 may produce good color distribution and improve the color impression perceived by the human eye. This is primarily made possible by better coverage in the green range of the color spectrum.

An advantage of the multilayer arrangement illustrated is that it makes it possible to bring about chip level conversion by using relatively thin layers. In particular, the thickness of the layers may be increased overall by repeatedly depositing thin layers, so likewise improving the efficiency of light conversion.

Furthermore, the final emission spectrum may result from adaptation of the thickness of the layers 91 of luminescent material and the layers 92 of luminescent material.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A light-emitting structure, comprising:
a p-doped region for injecting holes;
an n-doped region for injecting electrons; and
an active zone between the n-doped region and the p-doped region, the active zone comprising a plurality of InGaN quantum wells of a first type and at least one InGaN quantum well of a second type,
wherein the InGaN quantum well of the second type has a higher indium content than the InGaN quantum well of the first type;
wherein the InGaN quantum wells of the first type are separated from one another by (In)GaN barrier layers of the first type;
wherein a barrier layer of a second type is arranged between the quantum well of the second type and a peripherally located quantum well of the first type;
wherein a thickness of the barrier layers of the first type and a thickness of the barrier layer of the second type are different;
wherein the barrier layers of the first type are silicon-doped with a concentration of between $1.0 \times 10^{17} 1/cm^3$ and $2.0 \times 10^{19} 1/cm^3$;
wherein the barrier layer of the second type is doped with silicon with a concentration of no more than $5 \times 10^{17} 1/cm^3$; and
wherein the barrier layers of the first type and of the second type have a thickness between 2 nm and 6 nm.

2. The light-emitting structure according to claim 1, wherein the at least one quantum well of the first type adjoins the n-doped region and the at least one quantum well of the second type adjoins the p-doped region.

3. The light-emitting structure according to claim 1, wherein the indium content of the at least one quantum well of the first type is provided such that it emits radiation in a wavelength range of between 370 nm and 440 nm.

4. The light-emitting structure according to claim 1, wherein the barrier layers of the first type comprise an indium content of less than five percent.

5. The light-emitting structure according to claim 1, wherein the indium content of the quantum well of the second type is provided such that it emits radiation in a wavelength range of between 440 nm and 580 nm.

6. The light-emitting structure according to claim 1, wherein the number of quantum wells of the first type is between 2 and 30.

7. The light-emitting structure according to claim 1, wherein magnesium doping is provided in the p-doped region, wherein three times the concentration is achieved in places compared with the rest of the p-doped region.

8. A light-emitting component comprising:
a p-doped region for injecting holes;
an n-doped region for injecting electrons;
an active zone between the n-doped region and the p-doped region, the active zone comprising a plurality of InGaN quantum wells of a first type and at least one InGaN quantum well of a second type, wherein the InGaN quantum well of the second type has a higher indium content than the InGaN quantum well of the first type; and
a luminescent material arranged downstream of the quantum wells in an emission direction, the luminescent material being optically pumped by the light from the quantum wells
wherein the InGaN quantum wells of the first type are separated from one another by (In)GaN barrier layers of the first type;
wherein a barrier layer of a second type is arranged between the quantum well of the second type and a peripherally located quantum well of the first type;
wherein a thickness of the barrier layers of the first type and a thickness of the barrier layer of the second type are different;
wherein the barrier layers of the first type are silicon-doped with a concentration of between $1.0 \times 10^{17} 1/cm^3$ and $2.0 \times 10^{19} 1/cm^3$;
wherein the barrier layer of the second type is doped with silicon with a concentration of no more than $5 \times 10^{17} 1/cm^3$; and
wherein the barrier layers of the first type and of the second type have a thickness between 2 nm and 6 nm.

9. The light-emitting component according to claim 8, wherein the luminescent material comprises a mixture of a plurality of luminescent materials, wherein the mixture has similar emission wavelengths to the quantum well of the second type.

10. The light-emitting component according to claim 8, further comprising an absorber for UV light or violet light arranged in a beam path of the light-emitting component.

11. The light-emitting structure according to claim 1, wherein a difference between the indium content in the barrier layers of the first type and the quantum wells of the first type is less than 7%.

12. The light-emitting structure according to claim 1, wherein a thickness of the quantum well of the second type is between 2 nm and 7 nm.

13. The light-emitting structure according to claim 1, wherein one of the quantum wells of the first type and the quantum well of the second type directly adjoin the barrier layer of the second type.

14. The light-emitting structure according to claim 13, wherein the at least one quantum well of the second type comprises exactly one quantum well of the second type.

15. The light-emitting structure according to claim 12, wherein the indium content of the quantum well of the second type is between 12% and 25% mass.

* * * * *

UNITED STATES PATENT AND TRADEMARK OFFICE
CERTIFICATE OF CORRECTION

PATENT NO. : 8,390,004 B2  Page 1 of 1
APPLICATION NO. : 12/676592
DATED : March 5, 2013
INVENTOR(S) : Avramescu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 185 days.

Signed and Sealed this
First Day of September, 2015

Michelle K. Lee
*Director of the United States Patent and Trademark Office*